(12) United States Patent
Yamashita

(10) Patent No.: US 10,032,814 B2
(45) Date of Patent: Jul. 24, 2018

(54) IMAGE SENSOR ARRAY AND MANUFACTURING METHOD OF THE SAME

(71) Applicant: TAIWAN SEMICONDUCTOR MANUFACTURING COMPANY LTD., Hsinchu (TW)

(72) Inventor: Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/356,330

(22) Filed: Nov. 18, 2016

(65) Prior Publication Data

US 2018/0145098 A1 May 24, 2018

(51) Int. Cl.
*H01L 27/146* (2006.01)
*H01L 31/18* (2006.01)

(52) U.S. Cl.
CPC ...... *H01L 27/1461* (2013.01); *H01L 27/1469* (2013.01); *H01L 27/14634* (2013.01); *H01L 27/14636* (2013.01); *H01L 27/14643* (2013.01); *H01L 27/14685* (2013.01); *H01L 27/14689* (2013.01); *H01L 31/1808* (2013.01)

(58) Field of Classification Search
CPC ............ H01L 31/105; H01L 27/14643; H01L 31/035281; H01L 31/03529; H01L 31/036; H01L 31/03845; H01L 31/1055; H01L 31/18; H01L 31/1808
See application file for complete search history.

(56) References Cited

U.S. PATENT DOCUMENTS

| | | | | |
|---|---|---|---|---|
| 2007/0170536 A1* | 7/2007 | Hsu | ..... | H01L 31/1055 257/458 |
| 2013/0169914 A1* | 7/2013 | Takaiwa | ..... | H01L 31/02240 349/116 |
| 2014/0055838 A1* | 2/2014 | Lee | ..... | H01L 31/105 359/279 |
| 2015/0333202 A1* | 11/2015 | Ahn | ..... | H01L 31/105 257/184 |

(Continued)

OTHER PUBLICATIONS

Conor Rafferty et al., Monolithic germanium SWIR imaging array, IEEE, 2008.

*Primary Examiner* — Jaehwan Oh
(74) *Attorney, Agent, or Firm* — WPAT, P.C., Intellectual Property Attorneys; Anthony King

(57) ABSTRACT

An image sensor array is disclosed. The image sensor array includes: a semiconductor substrate; a lateral photo detector structure over the semiconductor substrate, wherein the lateral photo detector structure has a dislocation trapping region protruding to the semiconductor substrate; and an insulating layer disposed over the lateral photo detector structure and further extending to a space between the lateral photo detector structure and the semiconductor substrate; wherein the lateral photo detector structure includes a first type region and a second type region having a polarity opposite to a polarity of the first type region, and the first type region extends at least along a portion of a boundary between an upside of the intrinsic region and the insulating layer. An associated manufacturing method is also disclosed.

10 Claims, 17 Drawing Sheets

(56) References Cited

U.S. PATENT DOCUMENTS

2016/0079451 A1\* 3/2016 Ellis-Monaghan ... H01L 31/103
                                                  257/432
2016/0197216 A1\* 7/2016 Ji ..................... H01L 31/03845
                                                  257/465

\* cited by examiner

IMAGE SENSOR ARRAY AND MANUFACTURING METHOD OF THE SAME

BACKGROUND

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days millions of pixels and surrounding circuitry can be fabricated using the CMOS (complementary metal oxide semiconductor) technology. As today's CCD technology is based on silicon (Si)-technology, the detectable spectral ranges of CCD are limited to the wavelengths below 1 µm where Si exhibits absorption. Besides, CCD based imaging technique has also other shortcomings such as high efficiency response combined with high quantum efficiency over broad spectral ranges. This broad spectral detection is required in many applications. One of them is the free space laser communication where shorter (in visible ranges) and near infrared wavelengths is expected to be used. Image sensor array having broad spectral detection capability, disclosed in this invention, is expected to provide those features not available in today's CCD and other imaging (e.g. InGaAs, HgCdTe, or PbS) technologies. With well design of the array, appreciable resolution can also be achieved in image sensor array technology.

Detectors (a.k.a. photodiode or sensor pixel) especially of p/intrinsic/n (p-i-n) type conductivity have been studied extensively over the last decade for its application in optical communication. These photodiodes are for near infrared detection, especially the wavelength vicinity to 1310 and 1550 nm, where today's optical communication is dealt with. Present short-wave infrared (SWIR) p-i-n photodiodes usually suffers serious dark currents. Thus, minimizing the dark current would be desirable to improve the overall performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
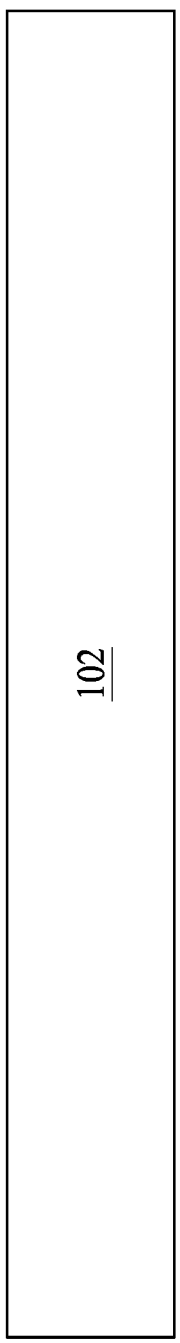
FIGS. 1 to 14 are cross-section views showing alternative fabrication process of the sensor device in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1 to 14 are cross-section views showing alternative fabrication process of the sensor device in accordance with the present disclosure wherein the same parts are represented by the same numerals so that repeated explanation is omitted here. This fabrication process described here is only for an example, not for the limitation. The structure and design mentioned here, may be for both top (also mentioned as 'front')-illuminated and bottom (also mentioned as 'back')-illuminated type image sensor and their array may have broad spectral detection ranges. The spectral array may be made from any material systems such as Si, Ge, SiGe, GaN, GaAs, InP, InGaAs, InAs, HgCdTe, CdTe, ZnCdTe, PbS etc. This may cover all sensor and its array with broad spectral detection ranges which covers from <300 nm (or as low as UV to long-Infrared (10 µm and more longer) wavelengths range. This disclosure also covers the sensors and their array's transferring technology to the independent substrate, bonding technology, and also covering their broadband optics system and their configuration, necessary for the broadband camera system.

Today's image sensor system made from any material systems (e.g. Si, Ge, Si:Ge, InP, GaAs, InSb etc.) comprising with image sensor array, read-out integrated circuit (ROIC), and optics systems which makes image transfer to electronics and their signal processing. Image sensor array (a.k.a. detector array) made from any material systems are mainly made from p-n or p-i-n structure and their junction is made from the bulk semiconductor material systems and they are made specifically for the specific spectral band. For example, (i) Si based p-i-n image sensor cover spectral band only in the visible ranges covering from 400 nm to 780 nm, (ii) image sensor made from GaAs cover only 400 to 850 nm, (iii) InP based image sensor cover only 980 nm to 1700 nm, (iv) InSb based image sensor covers only 3.0 to 5.0 µm, and (v) HgCdTe based image sensor cover 1.0 to 10 µm. Every material system can be used for making the detector element utilizing other material system. For easiness and simplicity in discussion, InP based material system is cited here. However, as mentioned above, this covers also other material systems such as GaN, Si, SiGe, GaAs, InP, InAs, HgCdTe, PbS, etc.

The method also enables forming crystalline structures in a trench structure, such as a trench structure patterned by a trench patterning-process (e.g. a standard complementary-metal-oxide-semiconductor (CMOS) STI (shallow-trench-insulation) process) or a STI-like trench patterned structure for dislocation trapping. The semiconductor devices formed over the trench structure(s) can have any desired lateral and/or vertical dimensions, such as lateral p-n and p-i-n structures. Dislocation trapping is a defect reduction and heteroepitaxy growth technique. As used herein, "dislocation trapping" refers generally to the technique(s) of causing defects to terminate at non-crystalline, e.g., dielectric sidewalls during heteroepitaxy growth, where the sidewalls are sufficiently high relative to the size of the growth area so as to trap most, if not all, of the defects. Dislocation trapping utilizes high aspect ratio openings, such as trenches or holes, to trap dislocations, preventing them from reaching the epitaxial film surface.

Furthermore, with customized dislocation trapping growth parameters, an enhanced lateral epitaxy overgrowth mode may be realized for expanded epitaxy beyond the trenched region, e.g., regions with openings formed therein, which yields bulky "free-standing" high quality materials centered above the initial trenched seed layer. Therefore, a combined dislocation trapping and epitaxy overgrowth technology greatly increases the quality and applicable film surface area of lattice-mismatched materials on substrates such as Si substrates. The relatively simple process enables reliable and reproducible results.

In FIG. 1, a semiconductor substrate 102 is provided, which can be a semiconductor crystalline substrate, such as a silicon substrate. The semiconductor substrate 102 used here may be a thick substrate. A dielectric layer 104 comprised of a dielectric material is deposited on the semiconductor substrate 102. The dielectric material can be any suitable materials, which is preferably, though not required, an oxide or nitride of a semiconductor element, such as SiOx and SiNx. Other materials are also applicable, such as an oxide or nitride of a metal element, a metal alloy, or a ceramic material.

Figure 2:
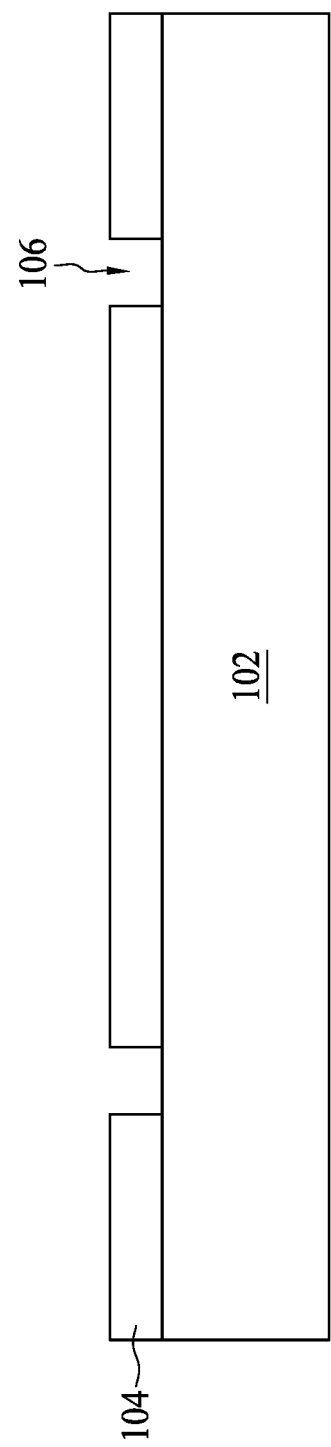

The dielectric layer 104 can be etched by a selected etching process so as to form openings, such as openings 106 in FIG. 2. In some embodiments, the openings 106 in the dielectric layer 104 can have a larger depth or width while still maintaining the desired aspect ratio for the following dislocation trapping epitaxy growth. In some embodiments, the openings 106 may have a depth of about 100 nanometers or larger, about 200 nanometers or larger, about 500 nanometers or larger, about 1 micron or larger, such as about 1.5 micron or larger, about 2 microns or larger, about 3 microns or larger, or about 5 microns or larger. The openings 106 may have a width of about 20 nanometers or larger, about 100 nanometers or larger, about 500 nanometers or larger, about 1 micron or larger, such as about 1.5 micron or larger, about 2 microns or larger, about 3 microns or larger, or about 5 microns or larger. The aspect ratio of the openings 106 may be about 0.5 or higher, such as about 1 or higher, about 1.5 or higher.

Figure 3:
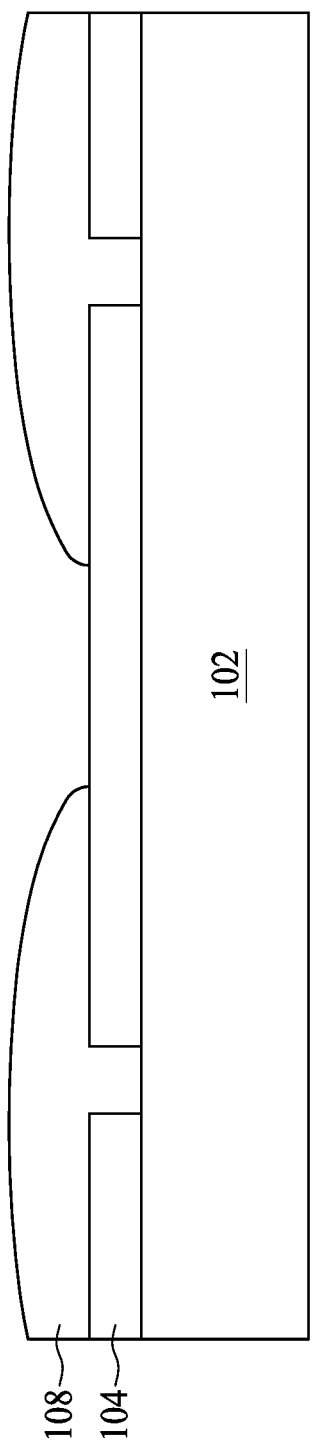

In the formed openings 106 as shown in FIG. 2, an epitaxial layer 108 may be formed in the openings 106 and further overgrowing over the dielectric layer 104 as diagrammatically illustrated in FIG. 3. For example, the epitaxial layer 108 may include a group IV element or compound, a III-V or III-N compound, or a II-VI compound. Examples of group IV elements include Ge and Si; and examples of group IV compounds include SiGe (examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

Figure 4:
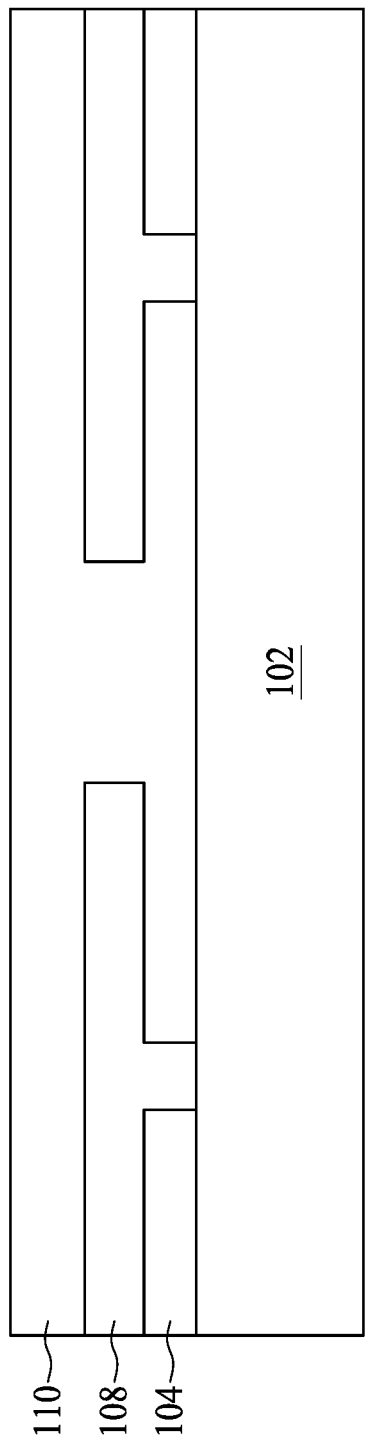

For obtaining a flat surface of the epitaxial layer 108, a CMP (chemical mechanical polishing) process may be performed as shown in FIG. 4. The overgrown portion of the epitaxial layer 108 can further be patterned so as to obtain desired dimensions (lateral and vertical dimensions and/or the shape) using for example, a photolithography process. A dielectric layer 110 comprised of a dielectric material the same or similar to the dielectric layer 104 may be deposited over the epitaxial layer 108.

Figure 5:
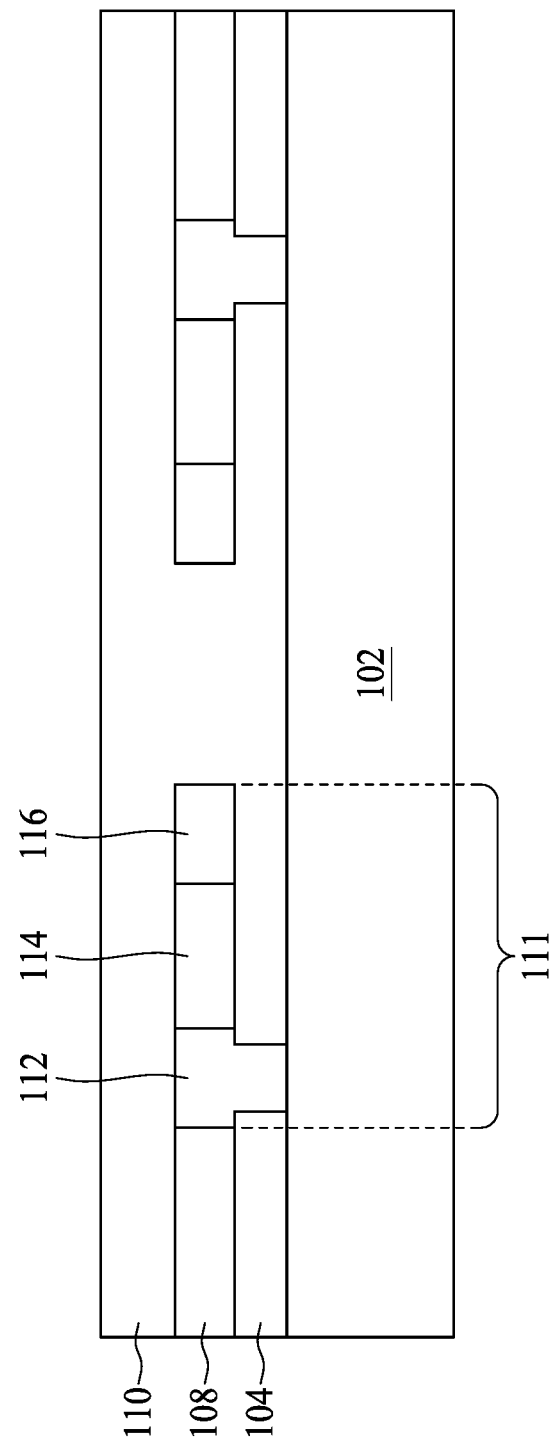

A semiconductor device or an element of a semiconductor device can then be formed in the overgrown crystalline portion of the epitaxial layer 108 as shown in FIG. 5. For example, a p-n or p-i-n structure can be formed. In this embodiment, at least a p-i-n structure 111 having a p-type region 112, an intrinsic region 114, and an n-type region 116 is formed in the overgrown crystalline portion of the epitaxial layer 108 for photo detecting. The p-type region 112 and the n-type region 116 can be obtained by doping.

Figure 6:
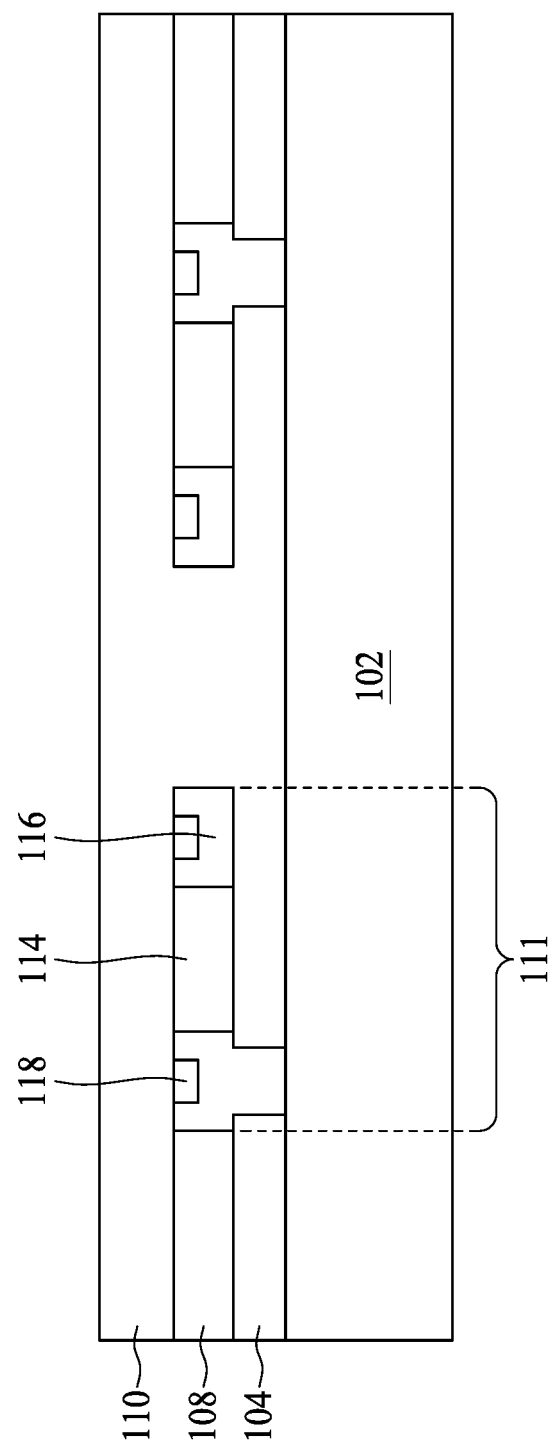
Figure 7:
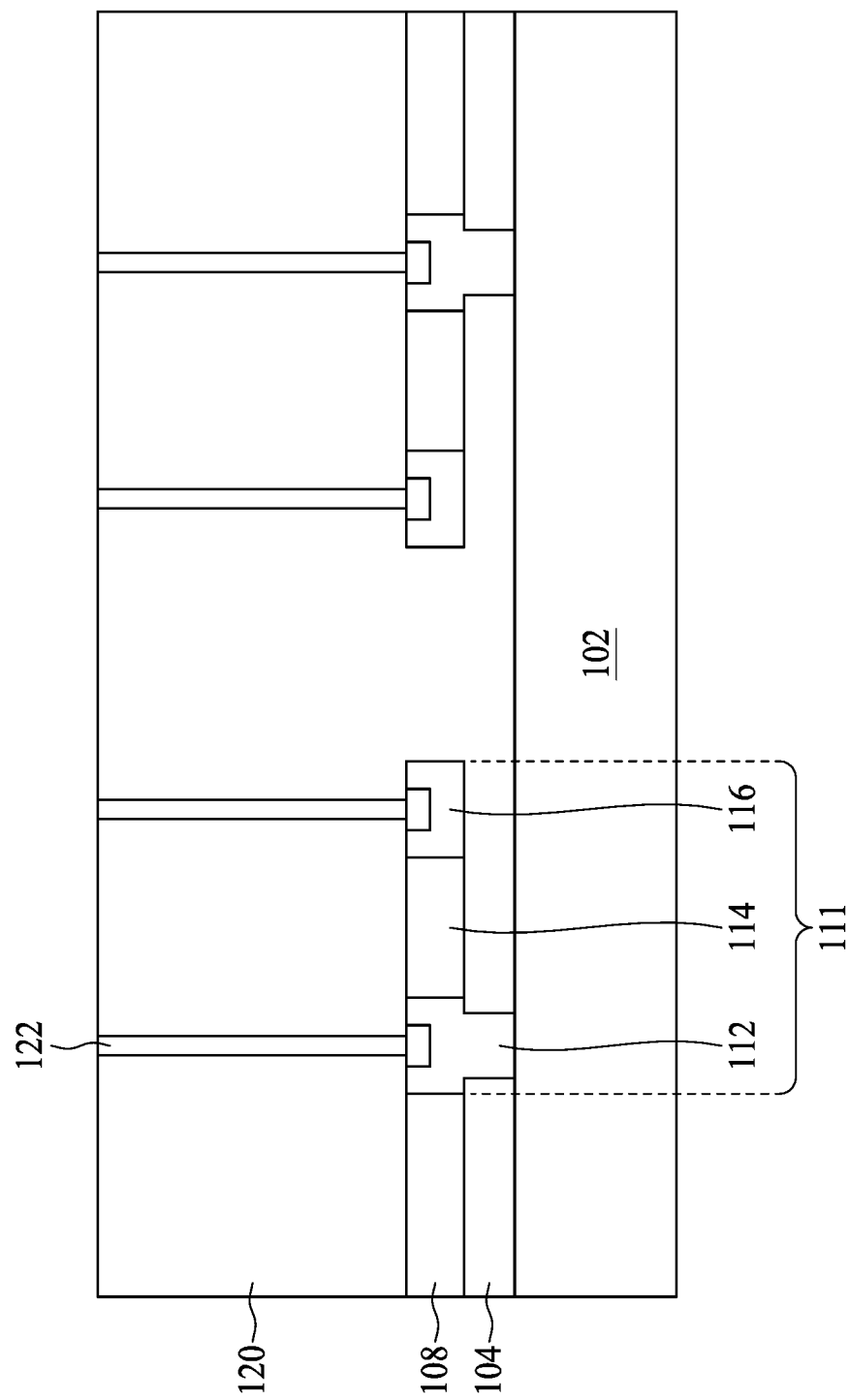

In FIG. 6, contact implant regions 118 are defined in the top of the p-type region 112 and the n-type region 116 by performing an appropriate dopant ion implantation of a doping type the same with region where the contact implant regions 118 is formed, using conventional techniques known to those of skill in the art. The dielectric layer 110 allows implantation therethrough while preventing damage of the exposed surface of the p-i-n detector structure 111. In FIG. 7 another dielectric layer 120 is further formed over the dielectric layer 110. Therefore, contact plugs 122 are defined in the dielectric layers 110 and 120 by first forming openings by, for example, photolithographic and anisotropic reactive ion etching (RIE) procedures. However, this is not a limitation of the present disclosure. Then, the contact plugs 122 are formed in openings. This is accomplished via deposition of a conductive layer, such as an arsenic or phosphorous, in situ doped polysilicon layer, using LPCVD procedures completely filling the openings. Removal of in situ doped polysilicon layer from the top surface of the insulator or semiconductor material 114 may be accomplished via a CMP procedure, or via a selective RIE procedure, using $Cl_2$ as an etchant for polysilicon, resulting in the contact plugs 122.

Figure 8:
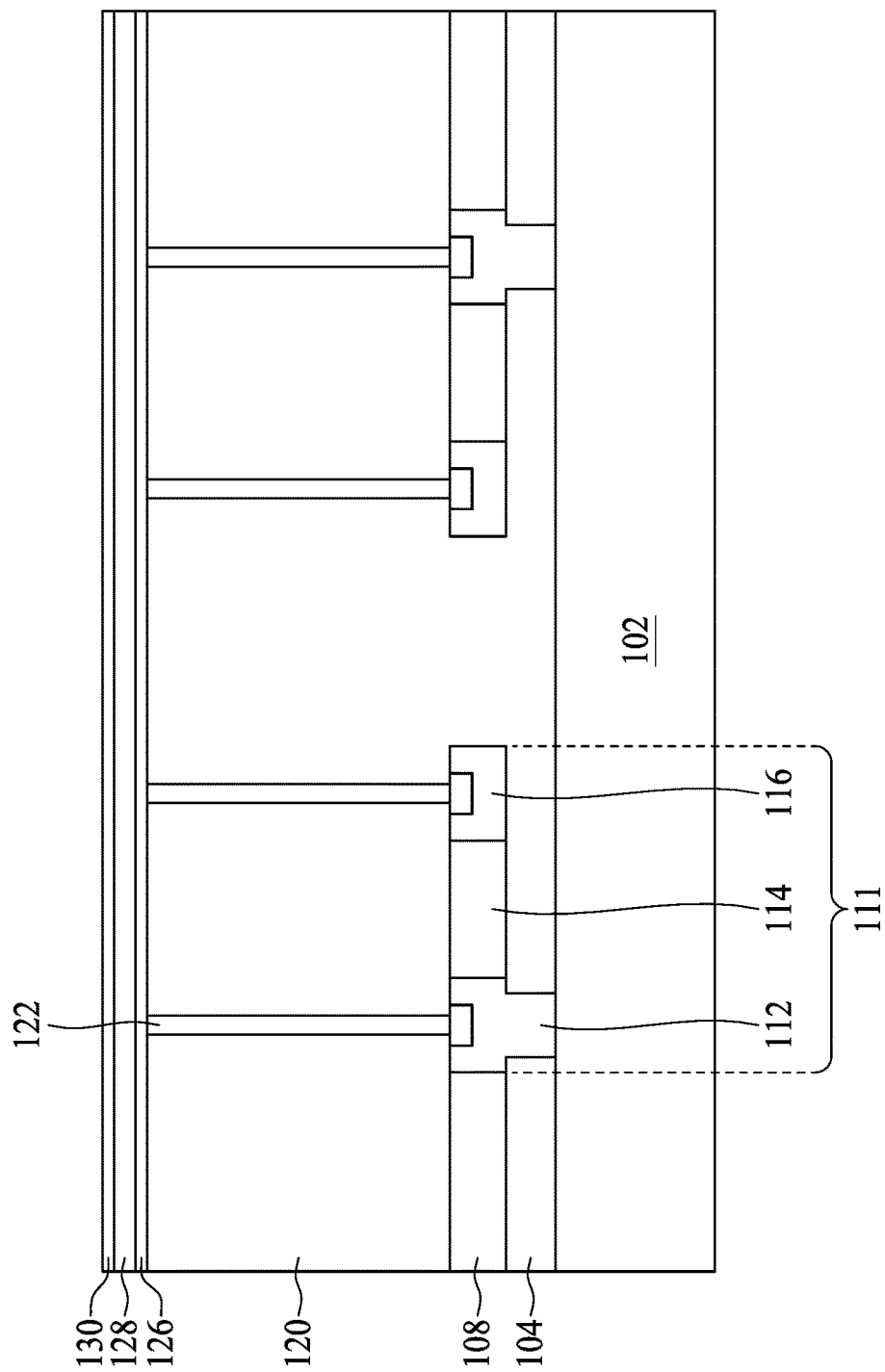

In FIG. 8, an etch stop layer 126, a dielectric material (or layer) 128, and a protective layer 130 are sequentially deposited over the surface of the dielectric layer 120. The etch stop layer 126 is a dielectric film and is used as an etch stop during an etching process for patterning an opening of conductive pad in the following steps. In some embodiments, the etch stop layer 126 is made of SiC with a thickness in a range from about 10 angstroms to about 5000 angstroms. In some embodiments, the insulating material 128 is made of $SiO_2$ with a thickness in a range from about 50 angstroms to about 10,000 angstroms. The protective layer 130 is made of SiN or SiON with a thickness in a range from about 5 angstroms to about 1000 angstroms, in accordance with some embodiments.

Figure 9:
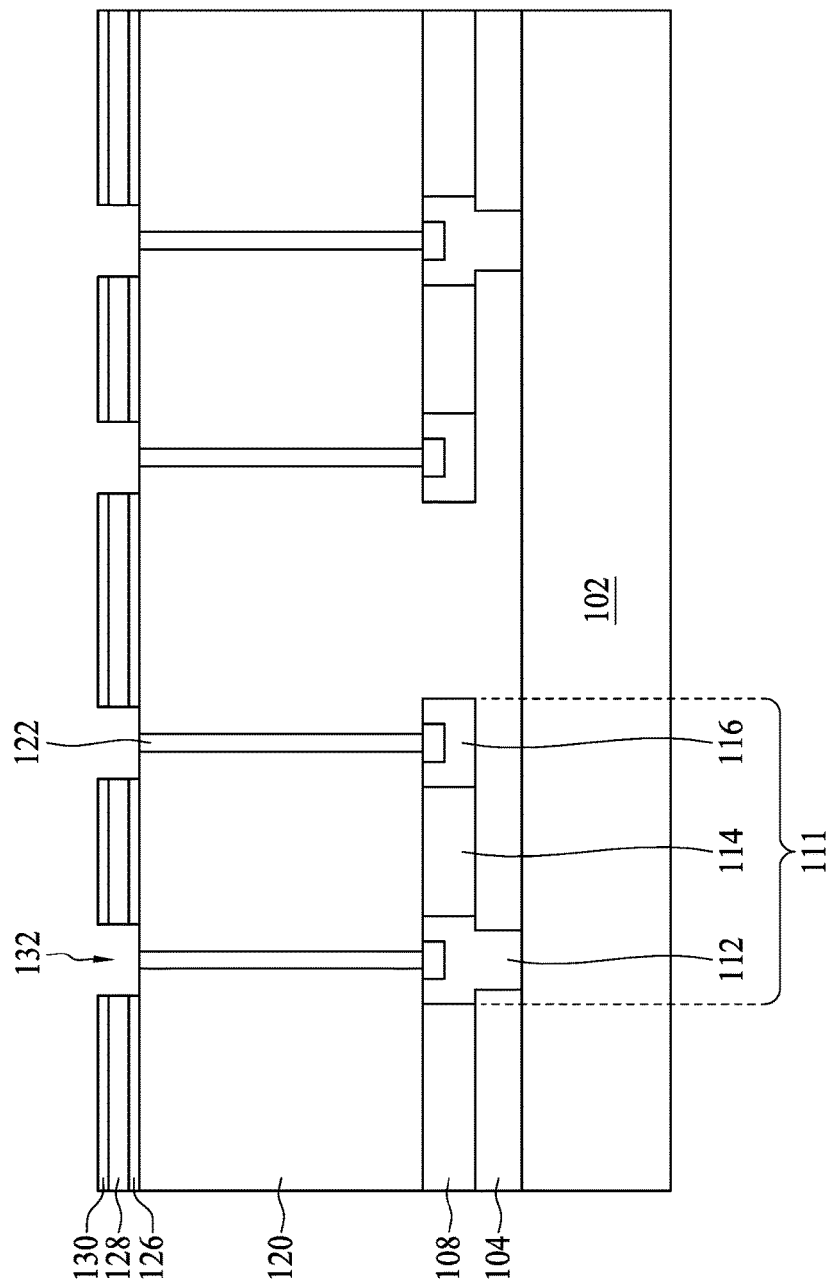
Figure 10:
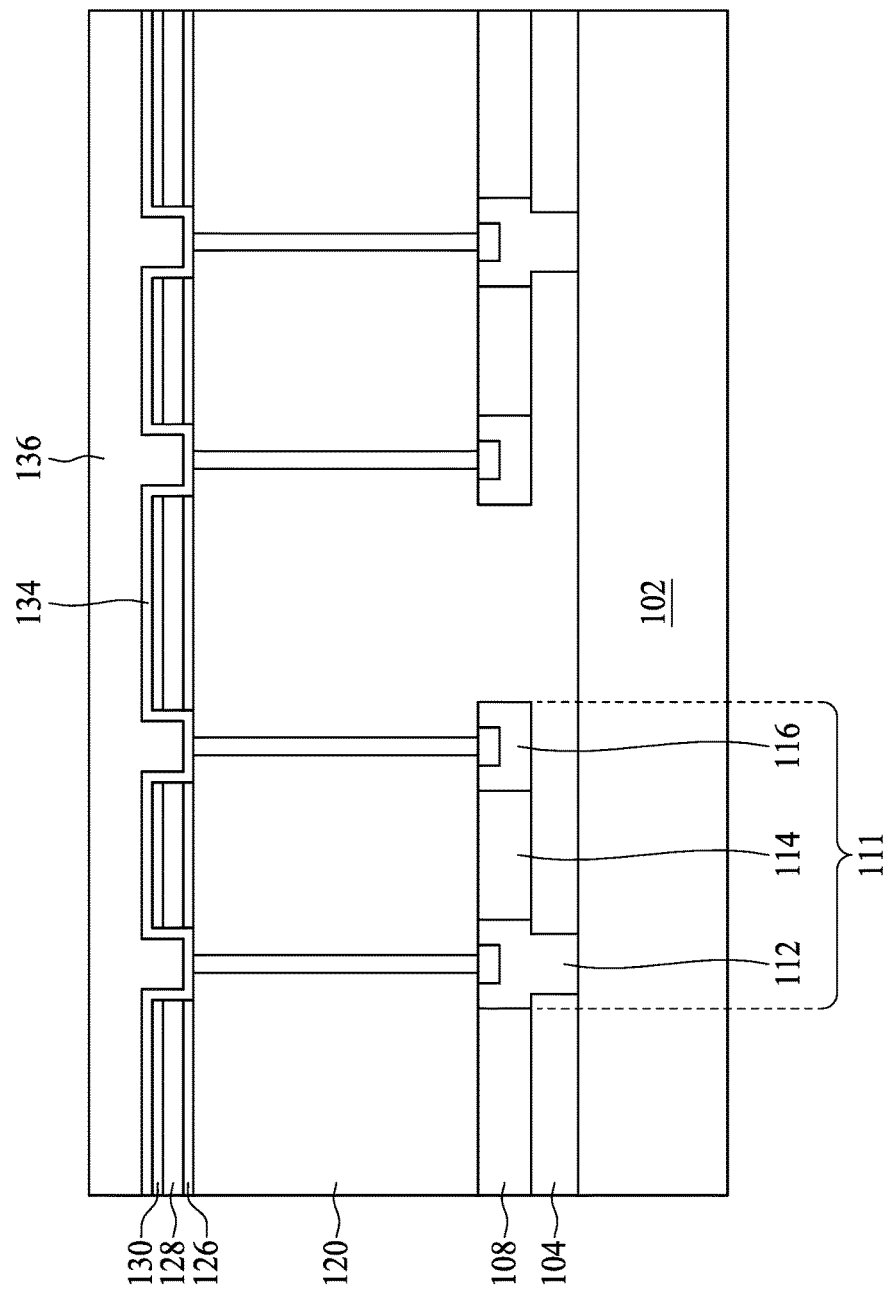

After the dielectric layers 126, 128 and 130 are deposited, openings 132 are formed via patterning and etching processes, as shown in FIG. 9 in accordance with some embodiments. The openings 132 expose tops of the contact plugs 122. After the openings 132 are formed, a barrier layer 134 is deposited to line openings 132 followed by depositing a conductive material 136, such as copper or copper alloy, to fill openings 132 as shown in FIG. 10. In some embodiments, the barrier layer 134 is made of TaN with a thickness in a range from about 50 angstroms to about 1000 angstroms. The TaN may be formed by physical vapor deposition (PVD) or other applicable methods. A thin copper seed layer (not shown) may be deposited on the barrier layer 134 to assist the formation of the conductive material (layer) 136. The thin copper seed layer is deposited by PVD with a thickness in a range from about 10 angstroms to about 500 angstroms. The copper-containing conductive material 136 is deposited by a plating process, in accordance with some embodiments. The copper seed layer is not shown in FIG. 10 because the copper seed layer merges with the copper-containing conductive material 136 that fills openings 132.

Figure 11:
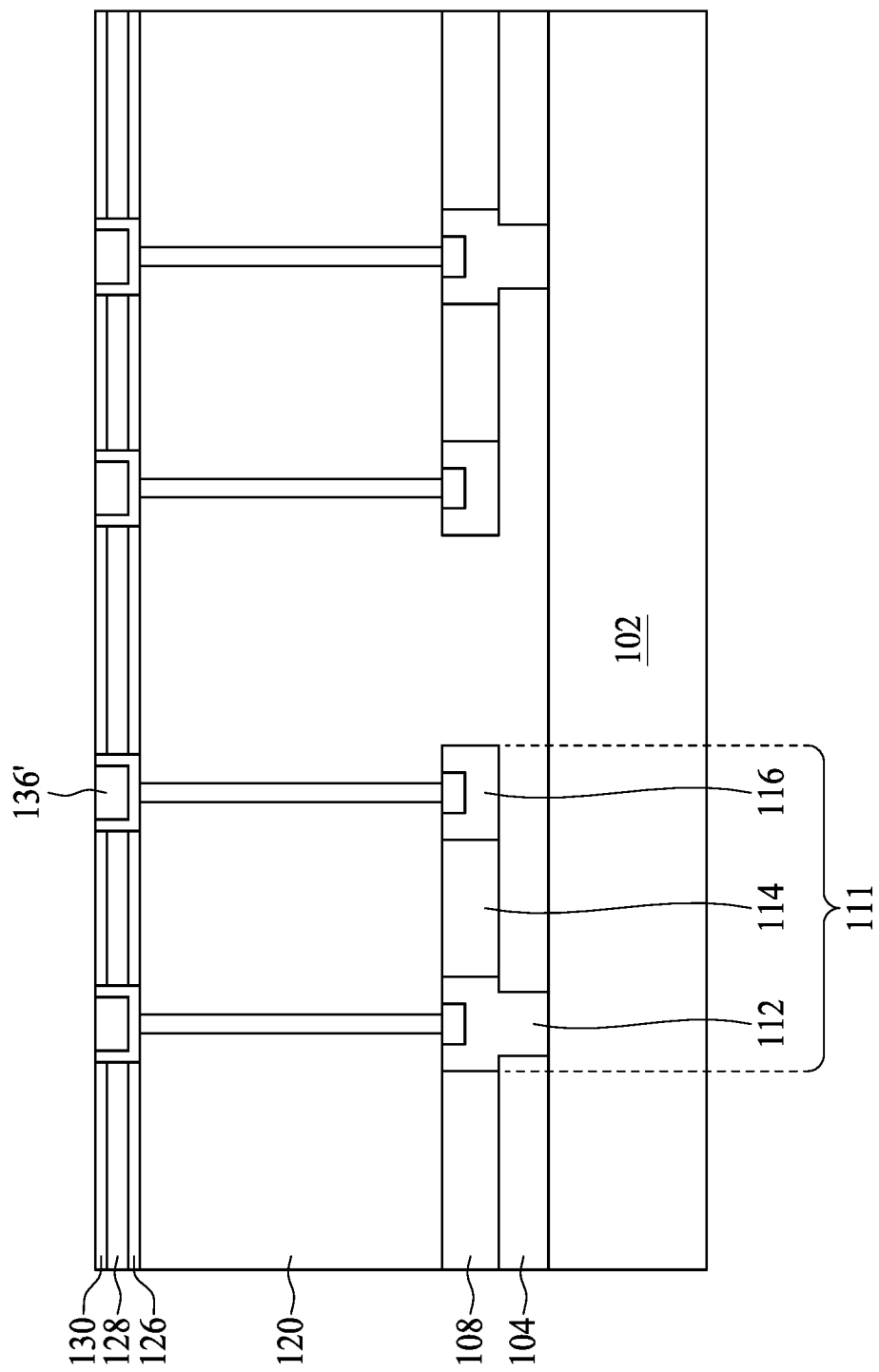

The copper-containing conductive material 136 and barrier layer 134 outside the openings 132 is then removed, such as by a chemical-mechanical polishing process, or an etching process as shown in FIG. 11. In this way, conductive pads 136' of the image sensor array are formed. As can be seen that the protective layer 130 is exposed after the removal process.

Figure 12A:
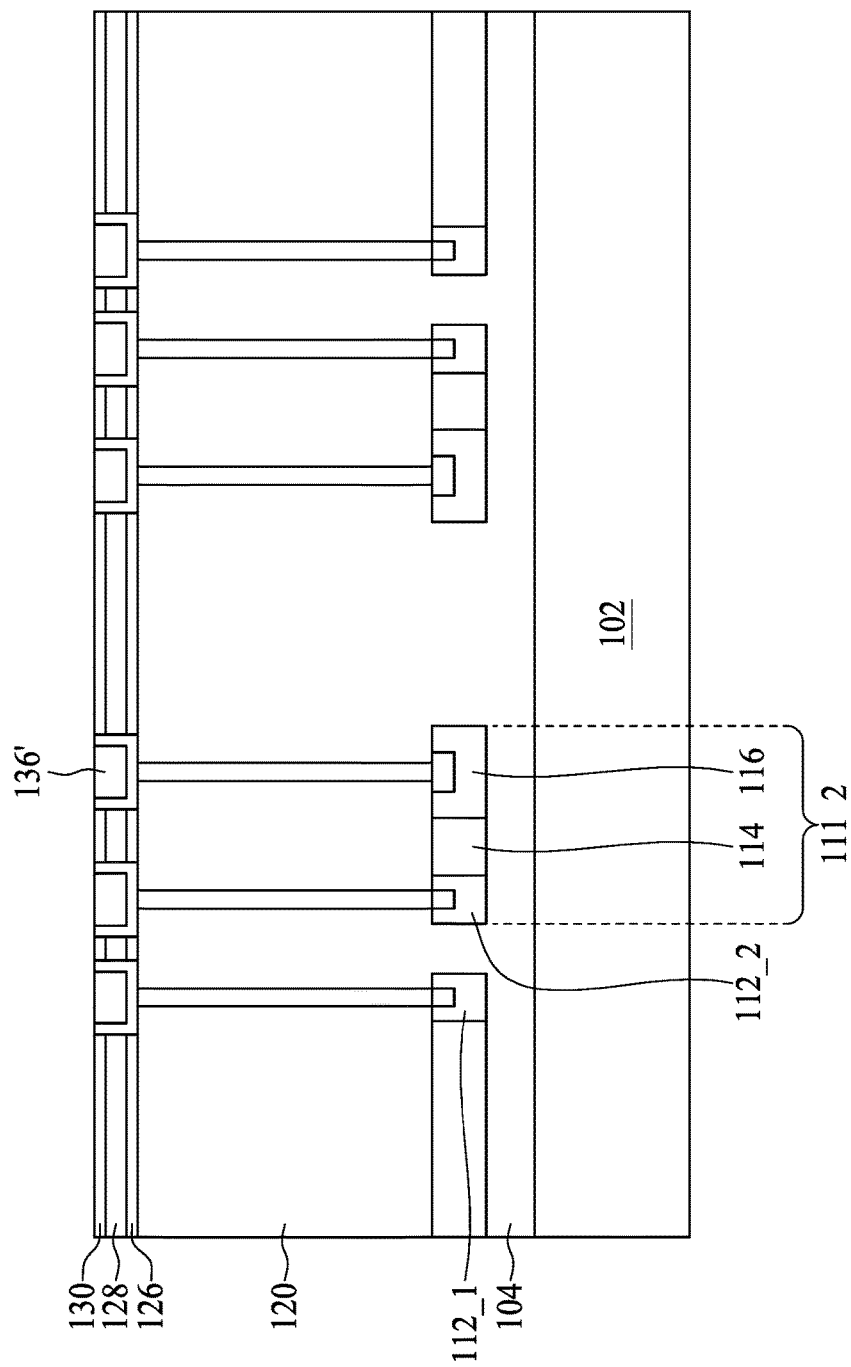
Figure 12B:
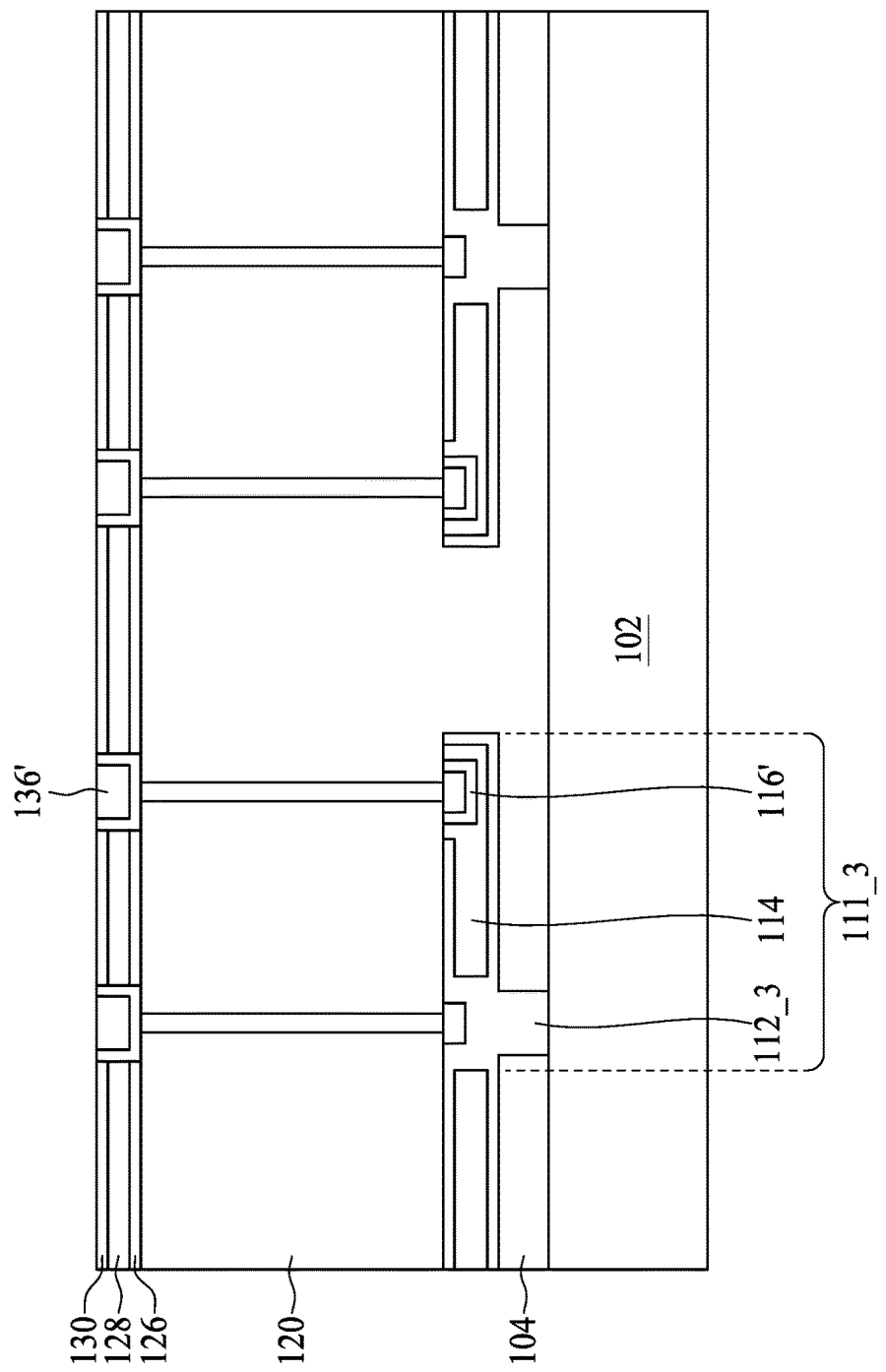
Figure 12C:
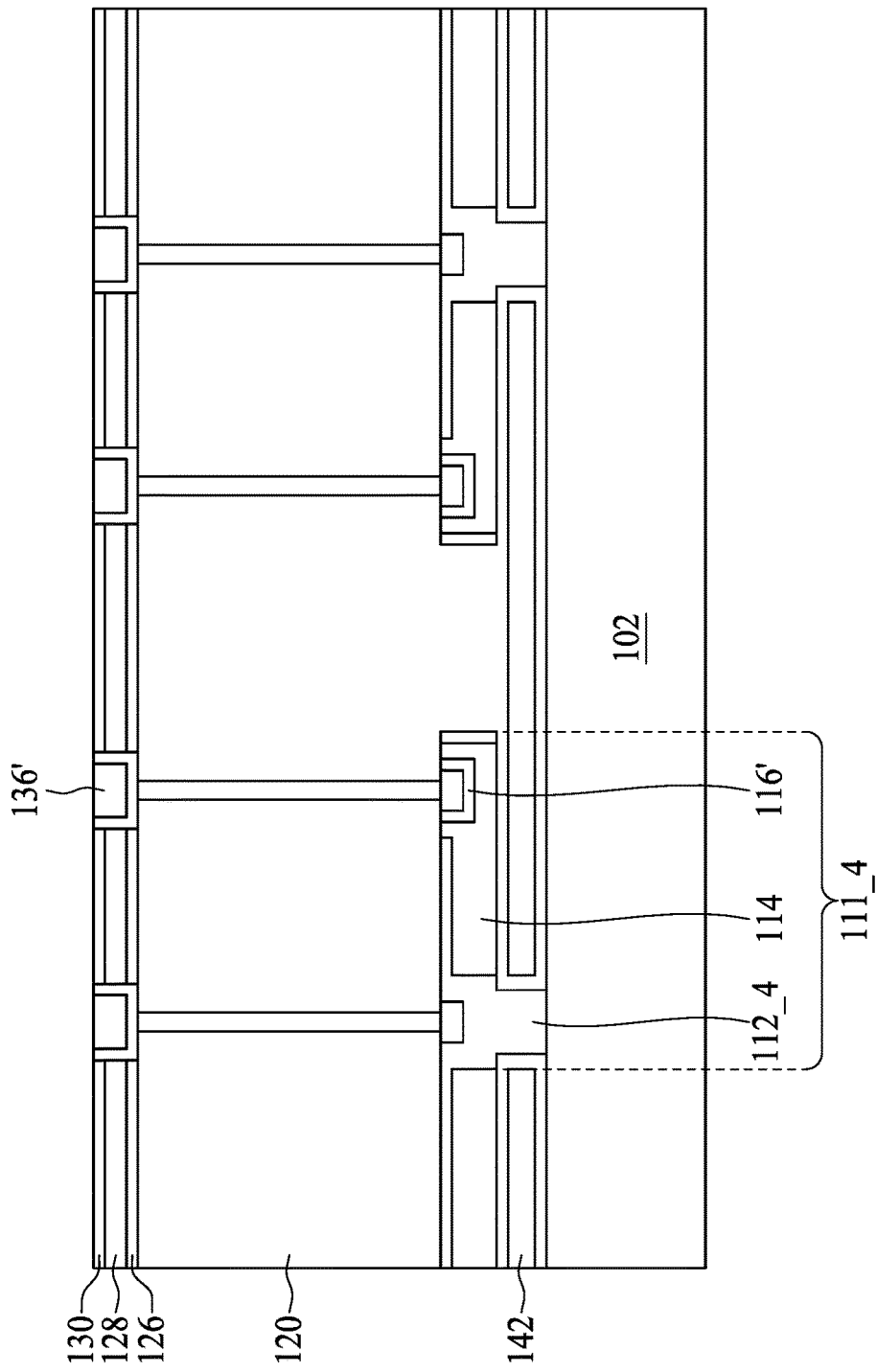
Figure 12D:
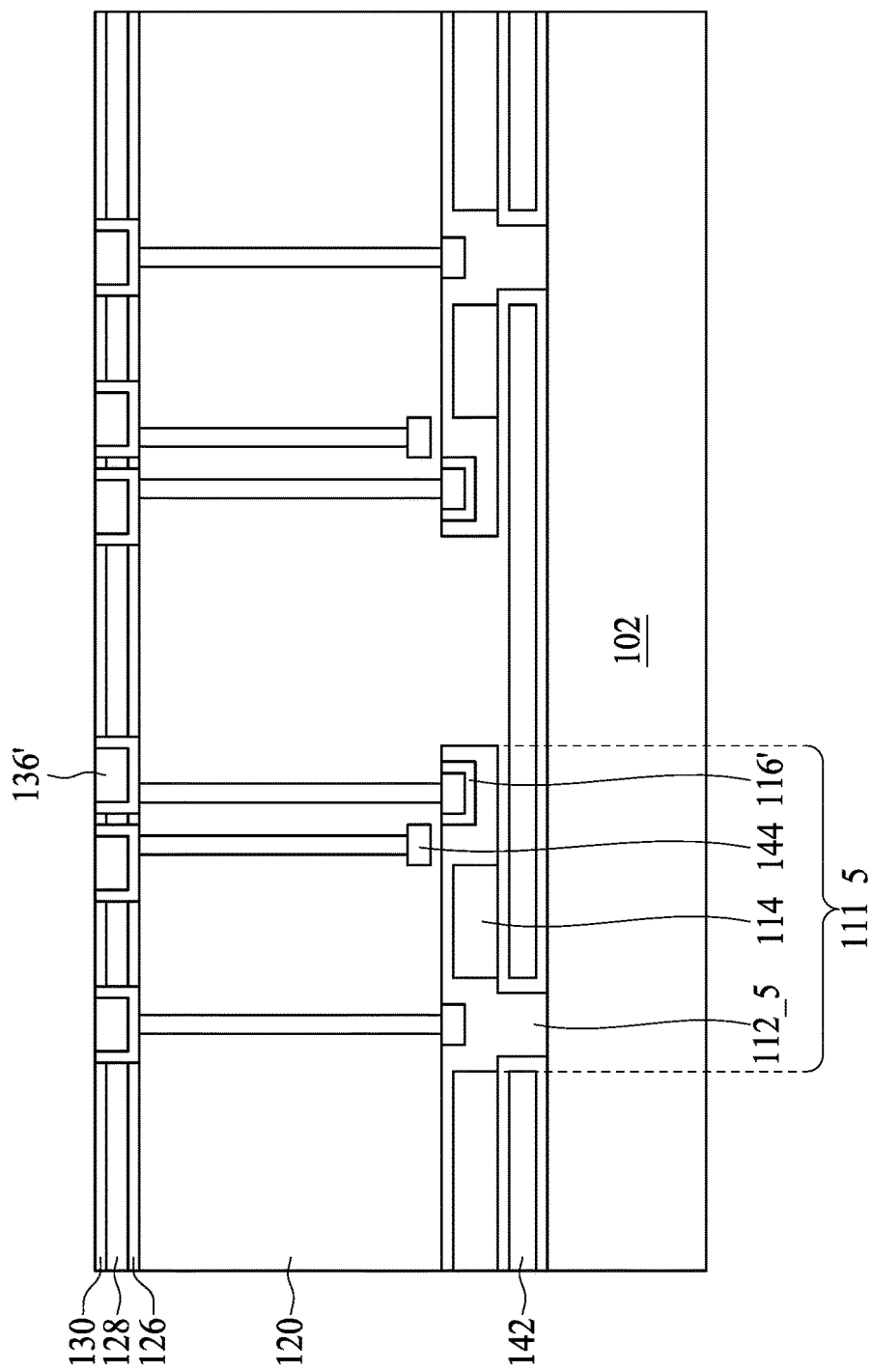
Figure 13:
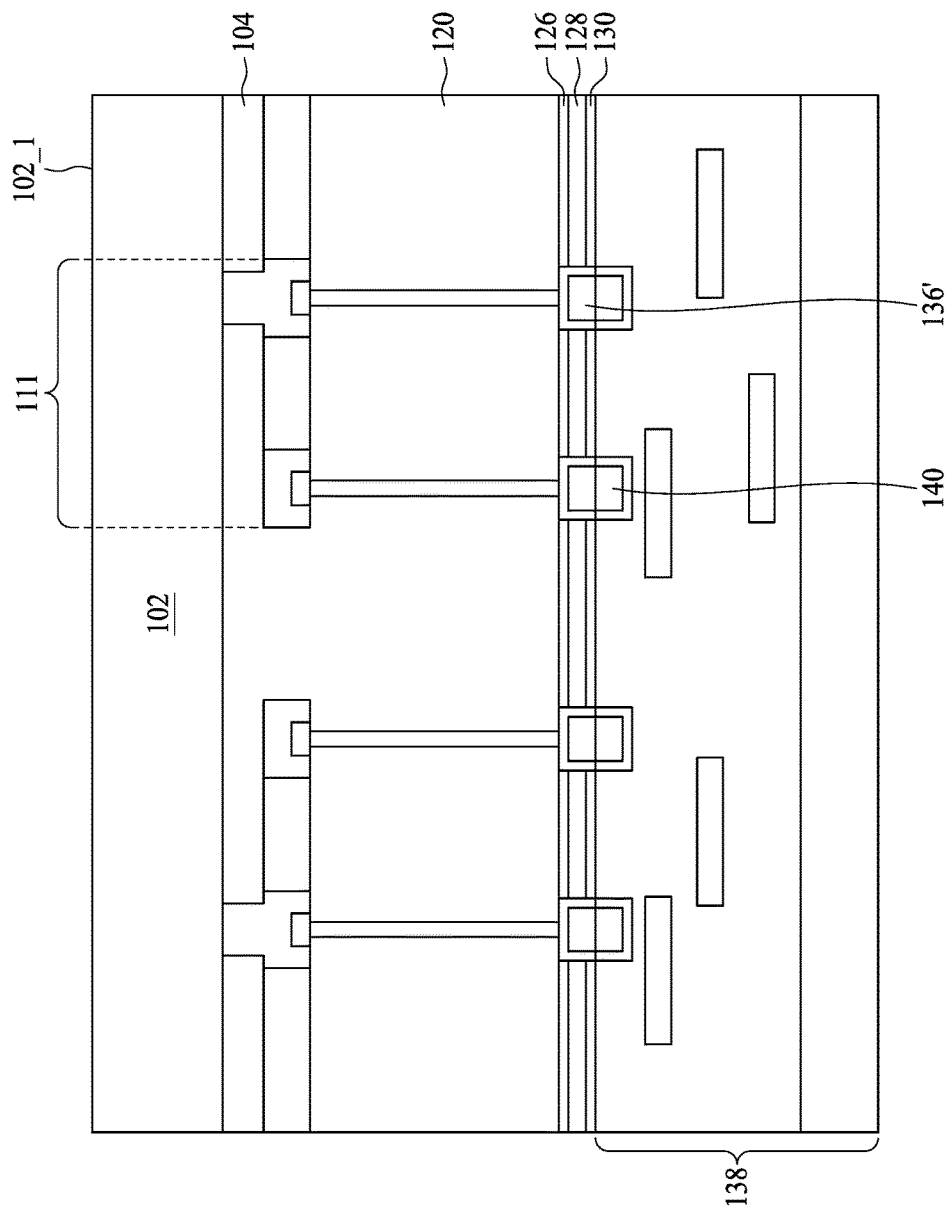

In the exemplary embodiment, the fabrication process may jump from FIG. 11 to FIG. 13. In FIG. 13, the image sensor array of FIG. 11 is hybrid bonded to a read-out integrated circuit (ROIC) 138, in accordance with some embodiments. FIG. 13 shows a width of the conductive pads 136' is about the same as a width of conductive pads 140 of the ROIC 138. The image sensor array and ROIC 138 are hybrid bonded together to form a sensor device by the application of pressure and heat. In some embodiments, during hybrid bonding, the sensor device is heated to a temperature in a range from about 100° C. to about 200° C., such that polymer materials at the interface between the image sensor array and ROIC 138 become a non-confined viscous liquid and are reflowed. By reflowing the polymer materials, voids therein are eliminated.

Afterwards, the sensor device are further heated to a higher temperature in a range from about 220° C. to about 380° C., such that the conductive pads 136' and 140 are interconnected by thermocompression bonding and the polymer materials are fully cured. In some embodiments, the pressure for hybrid bonding is in a range from about 0.7 bar to about 10 bar. The hybrid bonding process may be performed in an inert environment, such as an environment filled with inert gas including N2, Ar, He, or combinations thereof.

Figure 14:
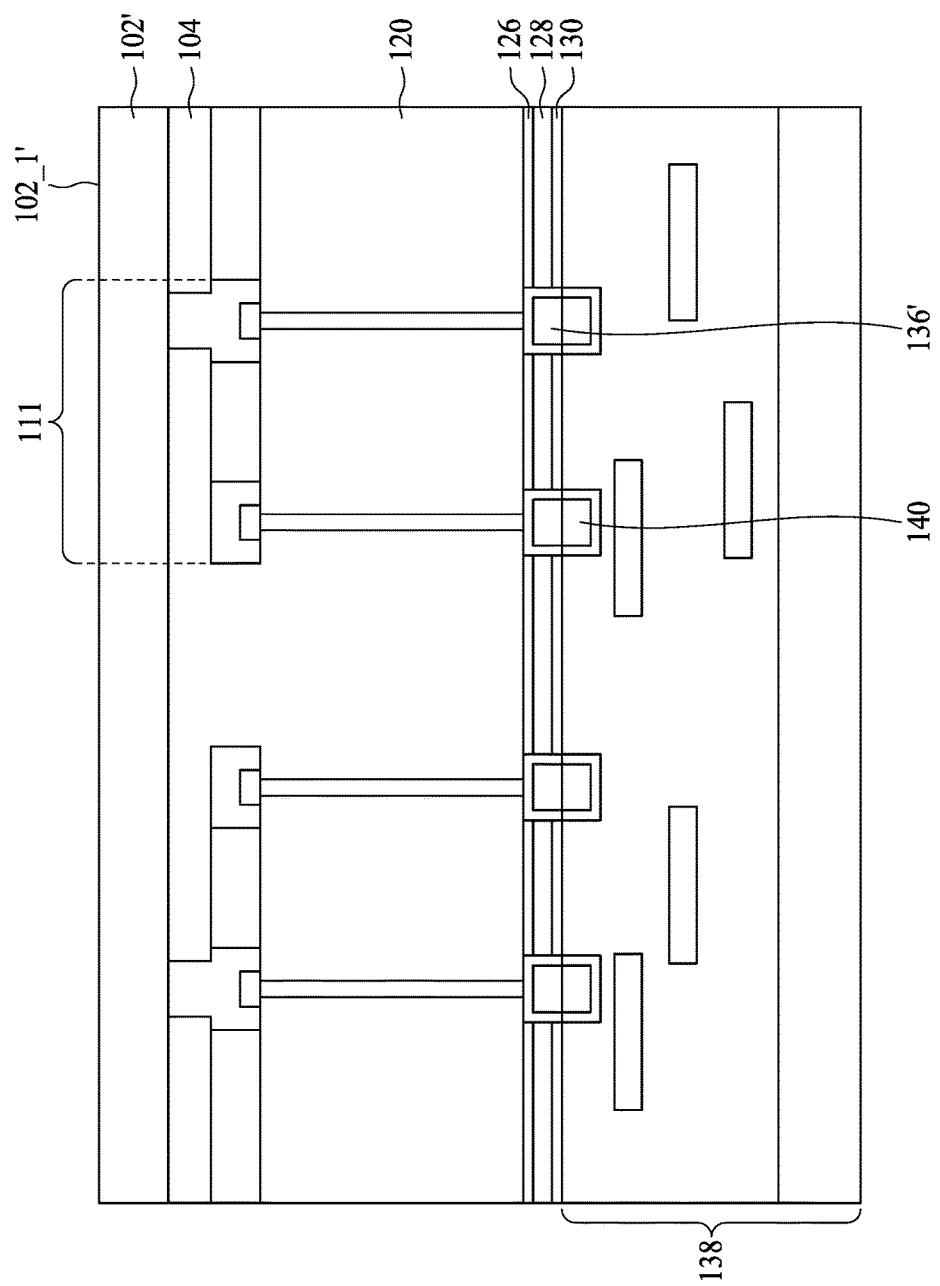

Referring to FIG. 14, after hybrid bonding, the stacking structure of the image sensor array and ROIC 138 is put on a tape (not shown) and a thinning process is performed on a bottom surface 102_1 of the semiconductor substrate 102. The thinning process may include a grinding operation and a polishing operation (such as chemical mechanical polishing (CMP)). After the thinning process, a wet etching operation is performed to remove the defects formed on the bottom surface 102_1' of the semiconductor substrate 102'.

In some embodiments, the p-i-n detector structure 111 may alternatively have different structures as illustrated in FIGS. 12a-12d. For example, the dislocation trapping region of the epitaxial layer 108 in the openings 106 may be removed by an etch process in order to further mitigate the negative impact induced by dislocation. Referring back to FIG. 12a, the p-type region 112 of the p-i-n structure 111 of FIG. 11 is divided into p-type regions 112_1 and 112_2 by removing the dislocation trapping region of the epitaxial layer 108 in the openings 106 and at least a portion of the epitaxial layer 108 over the openings 106. The etched portion may be backfilled by a dielectric material the same or similar to the dielectric layer 104.

In some embodiments, the n-type region 116 of the p-i-n structure 111 of FIG. 11 may have a reduced size, as can be seen in FIG. 12b, the n-type region 116'. Therefore, the reduced n-type region 116' may be encompassed by the intrinsic region 114 around lateral sides and a down side of the reduced n-type region 116' as shown in FIG. 12b. In some embodiments, the p-type region 112 of the p-i-n structure 111 of FIG. 11 further extends along the boundary between the intrinsic region 114 and the neighboring dielectric layers 110 and 104 to encompass at least a portion of the intrinsic region 114 as shown in FIG. 12b. For example, the p-type region 112_3 encompasses a portion of the top side, lateral side and down side of the intrinsic region 114 to protect the p-i-n detector structure 111_3.

In some embodiments, a gate layer 142 may be formed in the dielectric layer 104 at least between the intrinsic region 114 and the semiconductor substrate 102 as shown in FIG. 12c. In this embodiment, the p-type region 112_4 of the p-i-n detector structure 111_4 may not extend to the down side of the intrinsic region 114. The gate layer 142 may include a gate electrode. For example, during an operation of the final sensor device, the gate electrode of the gate layer 142 may be biased to a negative voltage. In this way, light incoming side of the p-i-n detector structure 111_4 is electrically pinned by the gate layer 142 biased to the negative voltage. Therefore, holes may be induced and gathering around the gate layer 142 to trap electrons, thereby reducing the induced dark current.

In some embodiments, as shown in FIG. 12d, a p-type region 112_5 of a p-i-n detector structure 111_5 not only extends to the n-type region 116', but further has an enlarged size at the n-type region 116' side. The p-type region 112_5 encompasses the n-type region 116' around lateral sides and a down side of the n-type region 116'. Another gate 144 may be formed above the p-type region 112_5 at the side close to the n-type region 116'. In particular, the gate 144 may be formed above the p-type region 112_5 between the intrinsic region 114 and the n-type region 116' of the p-i-n detector structure 111_5. The gate 144 may be controlled to turn on/off the equivalent transistor formed by the n-type region 116' and the p-type region 112_5 adjoining to the n-type region 116'. For example, the transistor may be turned off during at least a portion of the integration time period of the p-i-n detector structure 111_5; and the transistor may be turned on during at least a portion of the read-out time period of the p-i-n detector structure 111_5. By controlling a read-out window of the p-i-n detector structure 111_5, most of the dark current generated at the n-type region 116' may be blocked. In some embodiments, the intrinsic region 114 may be lightly doped to "n-"-type to increase the full well capacity (when the carrier is electron).

Some embodiments of the present disclosure provide an image sensor array. The image sensor array includes: a semiconductor substrate; a lateral photo detector structure over the semiconductor substrate, wherein the lateral photo detector structure has a dislocation trapping region protruding to the semiconductor substrate; and an insulating layer disposed over the lateral photo detector structure and further extending to a space between the lateral photo detector structure and the semiconductor substrate; wherein the lateral photo detector structure includes a first type region and a second type region having a polarity opposite to a polarity of the first type region, and the first type region extends at least along a portion of a boundary between an upside of the intrinsic region and the insulating layer.

Some embodiments of the present disclosure provide an image sensor array. The image sensor array includes: a semiconductor substrate; an insulating layer disposed over the semiconductor substrate; a first epitaxy region formed on semiconductor substrate and in the insulating layer; a second epitaxy region formed on the first epitaxy region and in the insulating layer, wherein the second epitaxy region has a width greater than a width of the first epitaxy region; and a lateral photo detector structure formed in the second epitaxy region; wherein the lateral photo detector structure includes a first type region and a second type region having a polarity opposite to a polarity of the first type region, and the first type region extends at least along a portion of a boundary between an upside of the intrinsic region and the insulating layer.

Some embodiments of the present disclosure provide a manufacturing method of an image sensor array. The method includes: providing a semiconductor substrate; forming a first insulating layer over the semiconductor substrate; removing a portion of the insulating layer to expose a portion of a top surface of the semiconductor substrate; depositing an epitaxial layer over the insulating layer; forming a second insulating layer over the epitaxial layer; and forming a lateral photo detector structure by ion implantation.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An image sensor array, comprising:
a semiconductor substrate;
a lateral photo detector structure over the semiconductor substrate, wherein the lateral photo detector structure has a dislocation trapping region protruding to the semiconductor substrate; and
an insulating layer disposed over the lateral photo detector structure and further extending to a space between the lateral photo detector structure and the semiconductor substrate;
wherein the lateral photo detector structure includes a first type region, an intrinsic region and a second type region having a polarity opposite to a polarity of the first type region, and the second type region is encompassed by the intrinsic region around lateral sides and a down side of the second type region, and the intrinsic region is encompassed by the first type region around a lateral side.

2. The image sensor array of claim 1, wherein the photo detector structure includes Ge.

3. The image sensor array of claim 2, wherein the first type region includes p-type Ge, and the second type region includes n-type Ge.

4. The image sensor array of claim 1, wherein the first type region further extends at least along a portion of a boundary between a down side of the intrinsic region and the insulating layer.

5. The image sensor array of claim 1, further comprising a first gate layer formed in the insulating layer between the lateral photo detector structure and the semiconductor substrate, wherein the first gate layer is biased to a negative voltage.

6. The image sensor array of claim 1, wherein first type region further encompasses the second type region around lateral sides and a down side of the second type region, and the intrinsic region is separated from the second region by the first type region.

7. The image sensor array of claim 6, further comprising a second gate layer disposed over the first type region between the intrinsic region and the second type region.

8. The image sensor array of claim 7, wherein the second gate layer is configured to control a read-out window of the lateral photo detector structure.

9. The image sensor array of claim 8, wherein the intrinsic region is lightly doped to a type the same to the second type region.

10. An image sensor array, comprising:
a semiconductor substrate;
a lateral photo detector structure over the semiconductor substrate, wherein the lateral photo detector structure has a dislocation trapping region protruding to the semiconductor substrate;
an insulating layer disposed over the lateral photo detector structure and further extending to a space between the lateral photo detector structure and the semiconductor substrate; and a gate layer disposed in the insulating layer between the lateral photo detector structure and the semiconductor substrate, wherein the gate layer is biased to a negative voltage;

wherein the lateral photo detector structure includes a first type region, an intrinsic region and a second type region having a polarity opposite to a polarity of the first type region, and the intrinsic region is disposed between the first region and the second type region, and the first type region further extends at least along a portion of a boundary between a down side of the intrinsic region and the insulating layer.

* * * * *